US007649801B2

(12) United States Patent
Lee

(10) Patent No.: US 7,649,801 B2
(45) Date of Patent: Jan. 19, 2010

(54) SEMICONDUCTOR MEMORY APPARATUS HAVING COLUMN DECODER FOR LOW POWER CONSUMPTION

(75) Inventor: Sang-Kwon Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 304 days.

(21) Appl. No.: 11/716,635

(22) Filed: Mar. 12, 2007

(65) Prior Publication Data

US 2008/0080293 A1 Apr. 3, 2008

(30) Foreign Application Priority Data

Sep. 28, 2006 (KR) ...................... 10-2006-0095176

(51) Int. Cl.
*G11C 8/00* (2006.01)

(52) U.S. Cl. .................. 365/230.06; 365/226; 365/227; 365/189.05; 365/189.11; 326/105

(58) Field of Classification Search ............ 365/230.06, 365/226, 227, 189.11, 189.05; 326/105
See application file for complete search history.

(56) References Cited

U.S. PATENT DOCUMENTS 4,198,700 A * 4/1980 Aoyama et al. ........ 365/230.06
4,760,562 A * 7/1988 Ohtani ........................ 365/227
5,604,711 A * 2/1997 Cheung ................. 365/230.06
6,269,046 B1 * 7/2001 Lee et al. ............... 365/230.06
7,102,935 B2 * 9/2006 Miki et al. ............. 365/189.09

FOREIGN PATENT DOCUMENTS

| | | |
|---|---|---|
| JP | 04-003399 | 1/1992 |
| JP | 04-061099 | 2/1992 |
| KR | 95-20965 | 7/1995 |
| KR | 1999-014168 | 2/1999 |

OTHER PUBLICATIONS

Korean Office Action, with English Translation, issued in corresponding Korean Patent Application No. KR 10-2006-0095176, dated on Oct. 30, 2007.
Korean Notice of Allowanace, issued in Korean Patent Application No. 10-2006-0095176, dated on Mar. 10, 2008.

* cited by examiner

*Primary Examiner*—VanThu Nguyen
*Assistant Examiner*—Eric Wendler
(74) *Attorney, Agent, or Firm*—IP & T Law Firm PLC

(57) ABSTRACT

The present invention relates to a column decoder for low power consumption in a semiconductor memory apparatus. The semiconductor device according to the present invention includes a column select signal decoder, which has a driving voltage input node and uses a driving voltage, for producing a plurality of column select signals by decoding a column select control signal; and a driving voltage supply controller for controlling a supply of the driving voltage to the driving voltage input node.

19 Claims, 5 Drawing Sheets

120
VDD_YI
YI<2>
YI<3>
YI<0>
YI<1>
VSS
VDD
YA12P<2>
YA12P<3>
YA12P<0>
YA12P<1>
YA345C
YA678C

SEMICONDUCTOR MEMORY APPARATUS HAVING COLUMN DECODER FOR LOW POWER CONSUMPTION

CROSS-REFERENCE TO RELATED APPLICATIONS

The present invention claims priority of Korean patent application number 10-2006-0095176, filed on Sep. 28, 2006, which is incorporated by reference in its entirety.

BACKGROUND OF THE INVENTION

The present invention relates to a column decoder of a semiconductor memory apparatus; and, more particularity, to a column decoder for low power consumption in the semiconductor memory apparatus.

Generally, a semiconductor memory apparatus includes a plurality of bit lines and word lines for storing data in a plurality of cells and reading out stored data from the cells, a selection circuit for selecting one of the plurality of bit lines and word lines, and a peripheral circuit, such as a plurality of sense amplifiers.

To select a cell of the memory device, the semiconductor memory apparatus also includes a row decoder, which produces a word line select signal XI to select a word line by decoding row address signals, and a column decoder, which produces a column select signal YI to select a bit line by decoding column address signals.

FIG. 1 is a circuit diagram illustrating a conventional driver for producing a column select signal YI in a column decoder.

Referring to FIG. 1, in the case where a column decoder does not operate, all the input signals are at a logic low level. In the case where the column decoder operates, signals YA345C and YA678C of the column select signals are at a logic high level and, when any of the signals YA12P<0>, YA12P<1>, YA12P<2> and YA12P<3> go to a logic high level, their respective column select signals YI<0>, YI<1>, YI<2> and YI<3> are enabled.

Since the circuit block described above is selected by column select control signals YA345C<0:7> and YA678C<0:7>, the semiconductor memory apparatus shown in FIG. 1 can have 256 number of column select signals YIs, e.g., YI<0:255>. As shown in FIG. 1, a driver to produce a column select signal YI in the conventional memory device comprises an inverter using an external voltage VDD and a ground voltage VSS as operating voltage sources.

The driver to produce a column select signal YI which is representative one of all column select signals, comprising an inverter using the external voltage VDD and the ground voltage VSS as the operating voltage sources, has a large size because of a large load applied thereto. Moreover, the drivers to produce the column select signals YI, comprising inverters using the external voltage VDD and the ground voltage VSS as the operating voltage sources, occupy a significant area of a semiconductor memory apparatus because the drivers are disposed in an array structure to produce the column select signals YI.

For example, in the case of a 512M DRAM, it requires the driver to produce the column select signals YI of 16×1024. Assuming that a width of a PMOS transistor, which is employed in a driver to produce the column select signal YI, is approximately 40 μm, a theoretical total width of the PMOS transistors employed in the driver to produce the column select signal YI is approximately 655360 μm in the abstract. Substantially, since all plural MOS transistors in the driver are not formed on the same plane and parts of the plural MOS transistors can be overlapped, a practical total width of the PMOS transistors employed in the driver inside a chip of the semiconductor memory apparatus is very smaller than above theoretical total width.

Furthermore, assuming that a leakage current of the PMOS transistor which is employed in driver to produce the column select signal YI is approximately 50 pA/μm, the total amount of leakage current caused by the driver for producing the column select signal YI becomes approximately 33 μA. This is 20% of the entire IDD 2P value. Here, the IDD 2P, as a specification of a precharge standby DC current of the semiconductor memory apparatus, defines an amount of the current consumed in a power down mode. 20% is a substantial portion of the entire IDD 2P value, and can have an effect on the yield of low power mobile DRAMs.

SUMMARY OF THE INVENTION

Embodiments of the present invention are directed to providing a semiconductor memory apparatus having a low power column decoder.

In accordance with an aspect of the present invention, there is provided a semiconductor device comprising: a column select signal decoding means, which has a driving voltage input node and uses a driving voltage, for producing a plurality of column select signals by decoding a column select control signal; and a driving voltage supply control means for controlling a supply of the driving voltage to the driving voltage input node.

DESCRIPTION OF SPECIFIC EMBODIMENTS

An object of the present invention is to provide a column decoder for low power consumption in the semiconductor memory apparatus.

The present invention reduces the leakage current generated in the column decoder by supplying a driving voltage, which is on/off controllable with isolation from the external voltage VDD, to the driver to produce the column select signal. As a result, the present invention can reduce the power consumption of the semiconductor devices.

Now the preferred embodiments according to the present invention will be described with reference to the accompanying drawings. Since preferred embodiments are provided for the purpose that those of ordinary skill in the art are able to understand the present invention, they may be modified in various manners, and the scope of the present invention is not limited by the described preferred embodiments.

Figure 1:
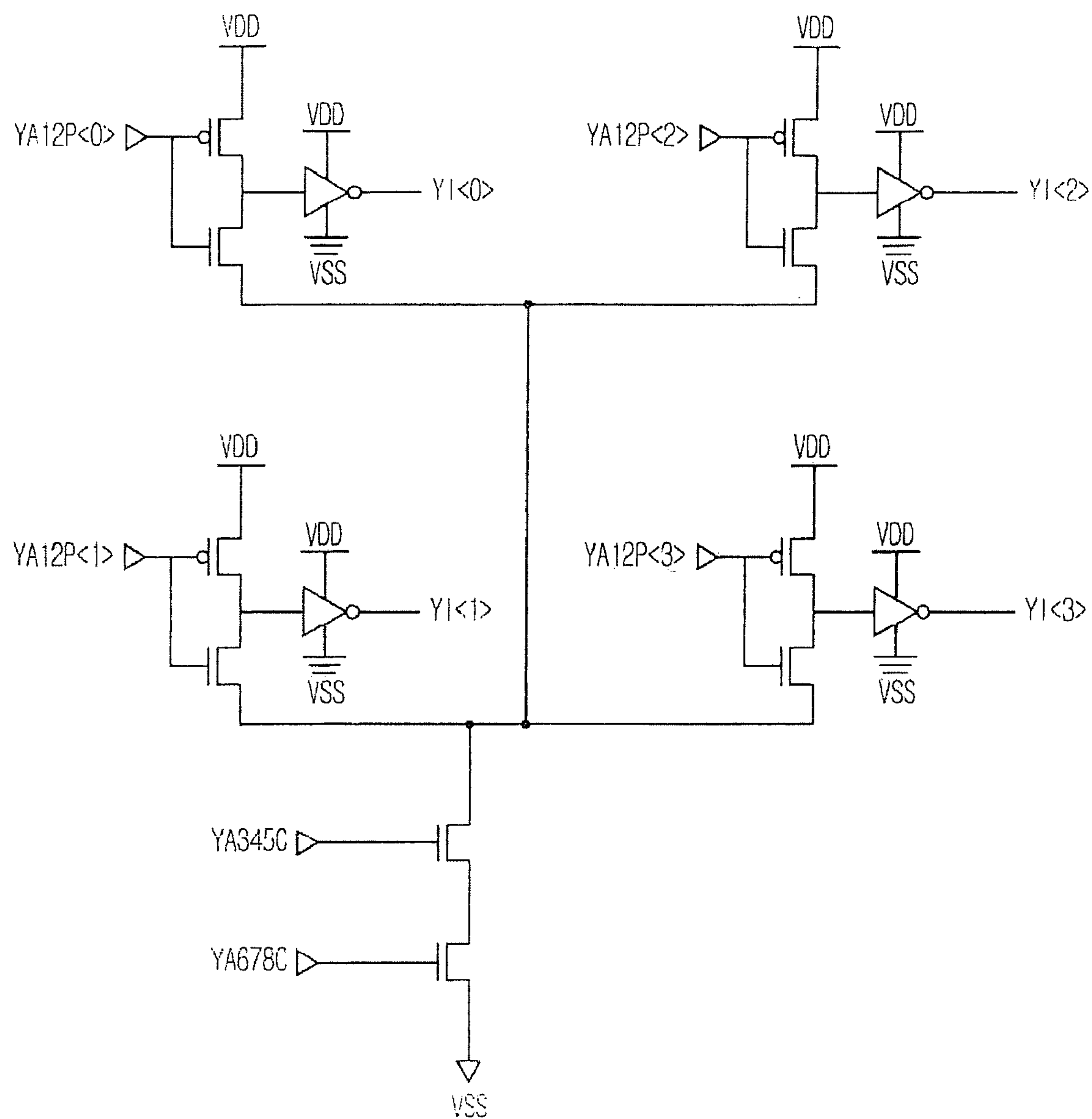
FIG. 1 is a circuit diagram illustrating a conventional driver to produce a column select signal in a column decoder.
Figure 2:
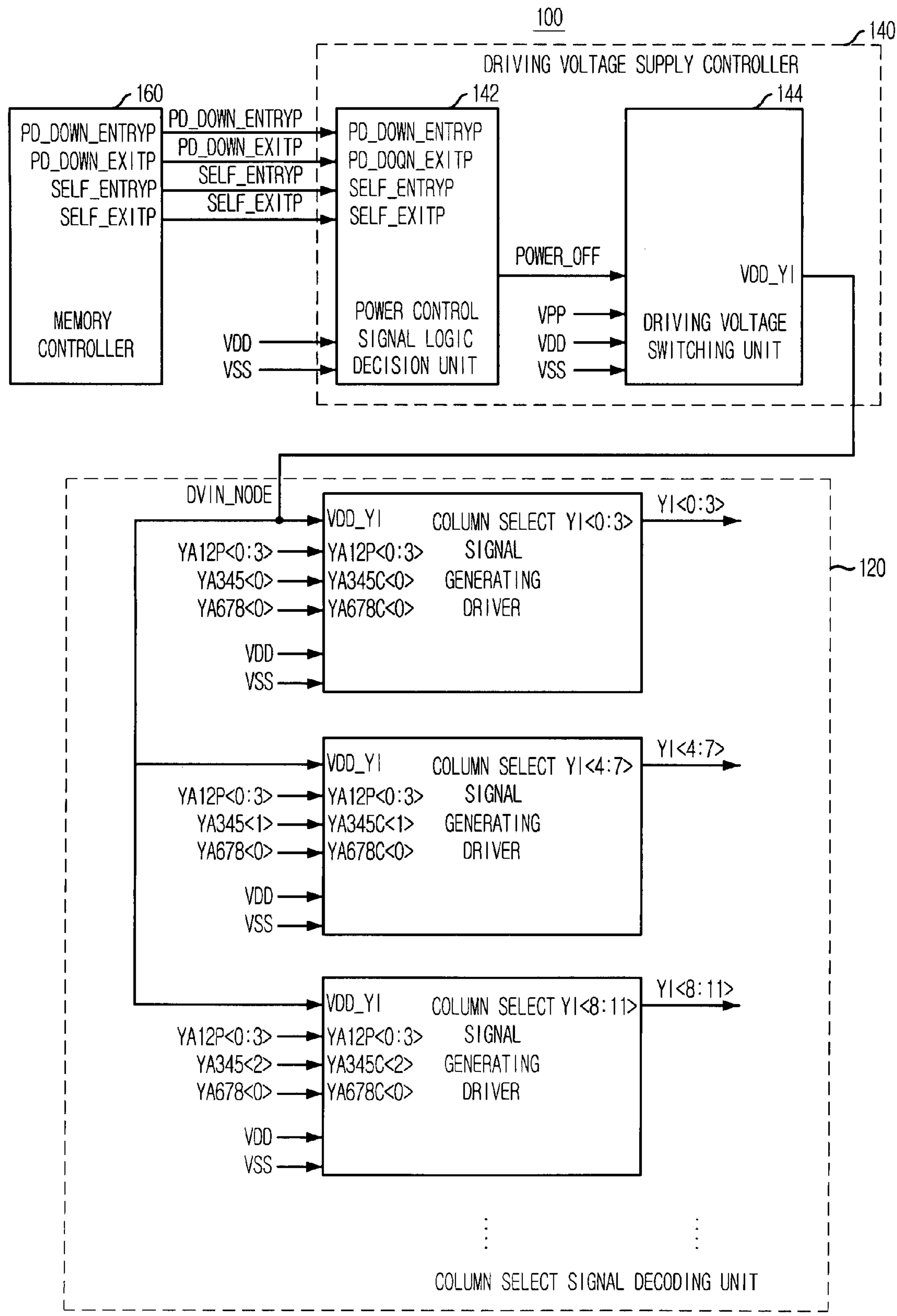
FIG. 2 is a block diagram illustration a column decoder according to the present invention.

FIG. 2 is a block diagram illustration of a column decoder according to the present invention.

Referring to FIG. 2, a column decoder according to the present invention includes a column select signal decoding unit 120 which has a driving voltage input node DVIN_NODE and uses a driving voltage VDD_YI as a power supply voltage source and produces a plurality of column select signals by decoding a plurality of column select control signals YA12P<0:3>, YA345<0:2> and YA678<0>, and a driving voltage supply controller 140 which controls the driving voltage VDD_YI that is provided to the driving voltage input node DVIN_NODE in order to reduce the leakage current caused by the column select signal decoding unit 120. The column decoder further includes a memory controller 160 which outputs both entry signals PD_DOWN_ENTRYP and SELF_ENTRYP and escape signals PD_DOWN_EXITP and SELF_EXITP related to a specific operating mode in which all of the plurality of column select signals (YI<0:3>, YI<4:7>, YI<8:11>, . . . ) are not activated. Herein, the plurality of column select control signals shown in FIG. 2 may be one of exemplary embodiments of the present invention. Practically, each column select control signal can be constituted with two, four, eight, or sixteen bits such as YA345<0:7>.

Here, a specific operating mode means a precharge power down standby mode or a self refresh mode. When at least one of the entry signals PD_DOWN_ENTRYP and SELF_ENTRYP related to a specific operating mode is activated, which is indicative of an entry of the precharge power down standby mode or the self refresh mode, the driving voltage supply controller 140 does not provide the driving voltage VDD_YI to the driving voltage input node DVIN_NODE.

Also, when at least one of the escape signals PD_DOWN_EXITP and SELF_EXITP related to a specific operating mode is activated, which is indicative of an escape from the precharge power down standby mode or the self refresh mode, the driving voltage supply controller 140 provides the driving voltage VDD_YI to the driving voltage input node DVIN_NODE.

The driving voltage supply controller 140 includes a power control signal logic decision unit 142 to decide a logic level of a power control signal POWER_OFF in response to the entry signals PD_DOWN_ENTRYP and SELF_ENTRYP and the escape signals PD_DOWN_EXITP and SELF_EXITP based on the specific operating mode, and a driving voltage switching unit 144 to control the supply of the driving voltage VDD_YI to the driving voltage input node DVIN_NODE in response to the logic level of the power control signal POWER_OFF.

Figure 3:
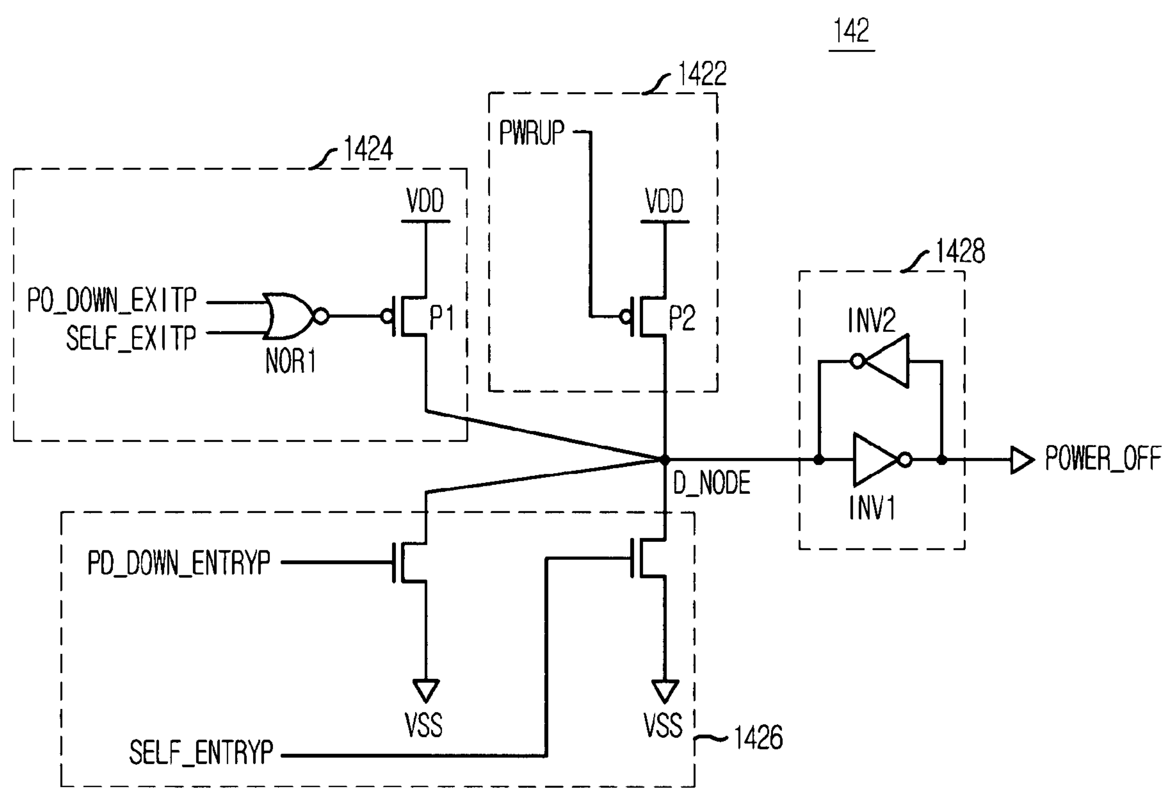
FIG. 3 is a circuit diagram illustrating a power control signal logic decision unit of a driving voltage supply controller in FIG. 2.

FIG. 3 is a circuit diagram illustrating the power control signal logic decision unit of the driving voltage supply controller in FIG. 2. Referring to FIG. 3, the power control signal logic decision unit 142 includes a pull-up driving unit 1424 for performing a pull-up driving operation on a driving node D_NODE in response to at least one of the escape signals PD_DOWN_EXITP and SELF_EXITP based on the specific operating mode, a pull-down driving unit 1426 for performing a pull-down driving operation on the driving node D_NODE in response to at least one of the entry signals PD_DOWN_ENTRYP and SELF_ENTRYP based on the specific operating mode, and a latch circuit 1428 for temporarily storing the logic value on the driving node D_NODE and outputting an inverted signal as a power control signal POWER_OFF.

The power control signal logic decision unit 142 further includes an initialization unit 1422 to perform a pull-up operation on the driving node D_NODE in response to a power-up signal PWRUP, which is generated during the initialization period of the semiconductor memory apparatus.

The pull-up driving unit 1424 includes a first NOR gate NOR1 to receive the escape signals PD_DOWN_EXITP and SELF_EXITP based on the specific operating mode and a first PMOS transistor P1 having a source-drain connection between the driving voltage VDD and the driving node D_NODE and having a gate to which an output signal of the first NOR gate NOR1 is applied. The pull-down driving unit 1426 includes a plurality of NMOS transistors N1 and N2, each of which has a drain-source connection between the ground voltage VSS and the driving node D_NODE, and the entry signals PD_DOWN_ENTRYP and SELF_ENTRYP, which are applied to the gates of the NMOS transistors N1 and N2 respectively.

The latch circuit 1428 includes a first inverter INV1, which receives a signal applied to the driving node D_NODE and outputs an inverted signal as the power control signal POWER_OFF, and a second inverter INV2, which inverts an output signal of the first inverter INV1 and outputs the inverted signal to an input of the first inverter INV1. The initialization unit 1422 includes a second PMOS transistor P2 having a gate to receive the power-up signal PWRUP generated at the initial time of the semiconductor memory apparatus and having a source-drain connection between the driving voltage VDD and the driving node D_NODE.

The power control signal logic decision unit 142 activates the power control signal POWER_OFF at a logic low level when at least one of the entry signals PD_DOWN_ENTRYP and SELF_ENTRYP based on the specific operating mode is activated at a logic low level. Also, the power control signal logic decision unit 142 inactivates the power control signal POWER_OFF at a logic high level when at least one of the escape signals PD_DOWN_EXITP and SELF_EXITP based on the specific operating mode is activated at a logic high level.

Figure 4:
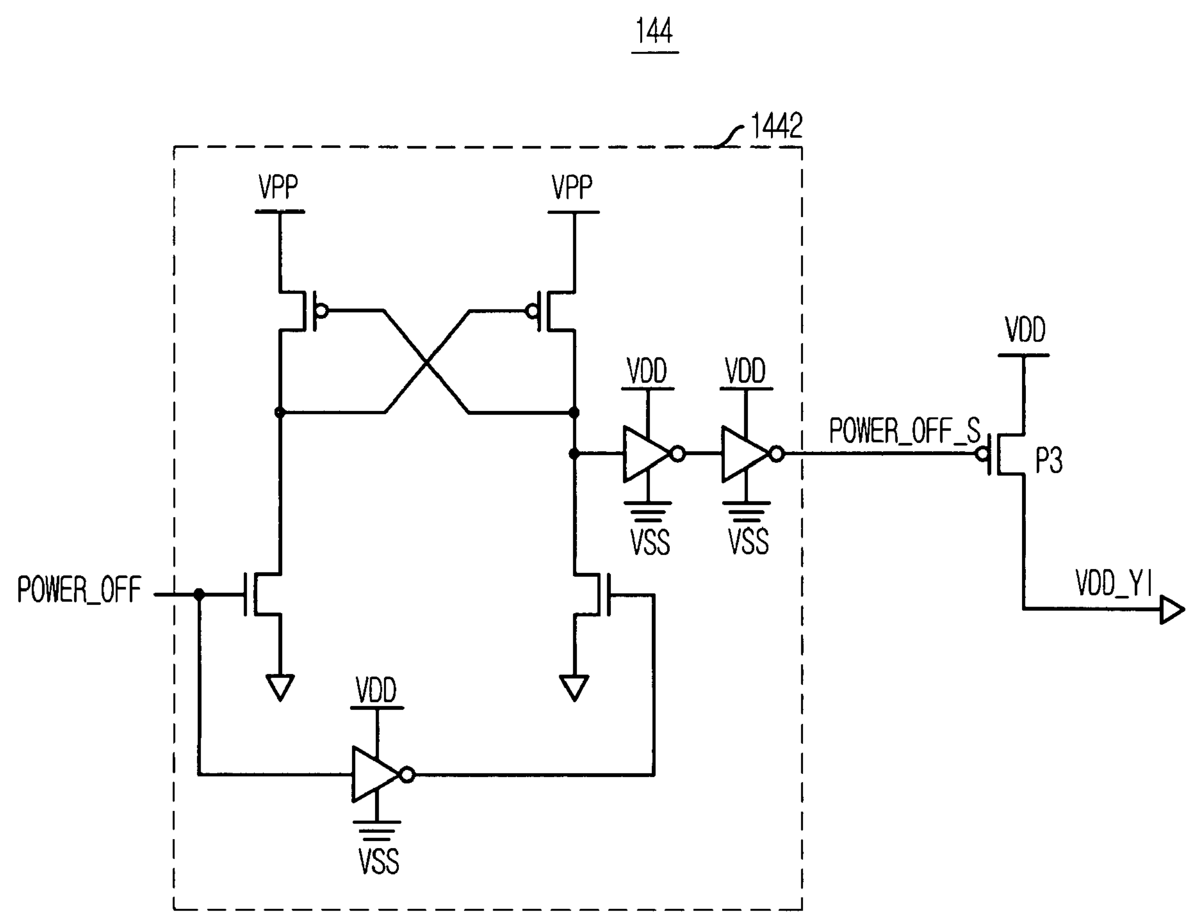
FIG. 4 is a circuit diagram illustrating a driving voltage switching unit of the driving voltage supply controller in FIG. 2.

FIG. 4 is a circuit diagram illustrating the driving voltage switching unit of the driving voltage supply controller in FIG. 2. Referring to FIG. 4, the driving voltage switching unit 144 includes: a third PMOS transistor P3 which has a source-drain connection between the power voltage VDD and the driving input node DVIN_NODE of the column select decoding unit 120 and has a gate to which a shifted power control signal POWER_OFF_S is applied; and a level shifting unit 1442 to shift a potential level of the power control signal POWER_OFF to a predetermined potential level (VPP in FIG. 4) and generate the shifted power control signal POWER_OFF_S in order to reduce the leakage current generated in the third PMOS transistor P3. Even though it is not shown in FIG. 4, it is possible to apply an NMOS transistor which has a drain-source connection between the power voltage VDD and the driving input node DVIN_NODE of the column select decoding unit 120 and has a gate to which the power control signal POWER_OFF is applied, instead of the third PMOS transistor P3 having the source-drain connection between the power voltage VDD and the driving input node DVIN_NODE of the column select decoding unit 120 and the gate to receive the shifted power control signal POWER_OFF_S.

However, in the embodiment where the driving voltage switching unit 144 is implemented by the NMOS transistor, the power control signal POWER_OFF is active at a logic high level and is inactive at a logic low level.

In another embodiment of the present invention, when the power control signal POWER_OFF is active, whether at a logic high or low level, the driving voltage VDD_YI is supplied to the driving voltage input node DVIN_NODE. Otherwise, if the power control signal POWER_OFF is inactive, whether at a logic low or high level, the driving voltage VDD_YI is not supplied to the driving voltage input node DVIN_NODE.

Figure 5:
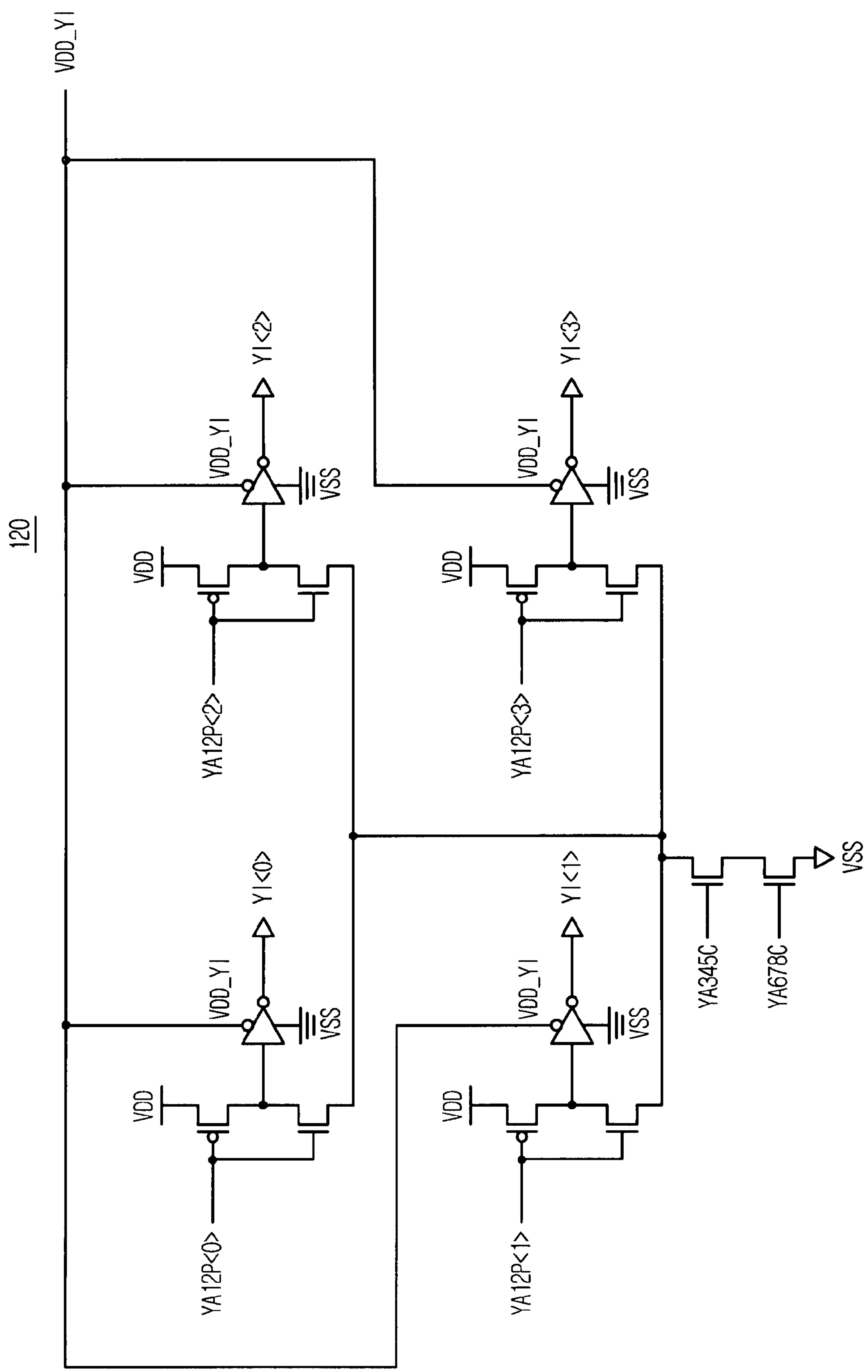
FIG. 5 is a circuit diagram illustrating a driver to produce a column select signal in a column select signal decoding unit of the driving voltage supply controller in FIG. 2.

FIG. 5 is a circuit diagram illustrating the driver to produce the column select signal YI in the column select signal decoding unit of the driving voltage supply controller in FIG. 2. Referring to FIG. 5, the driver to produce the column select signal YI according to the present invention comprises inverters which use the driving voltage VDD_YI from the driving voltage supply controller 140 and the ground voltage VSS as their power supply voltage sources.

As mentioned above, the driving voltage VDD_YI supplied from the column select signal decoding unit is isolated from the external voltage VDD when the semiconductor memory apparatus enters a precharge power down standby mode or a self refresh mode. That is, if the semiconductor memory apparatus enters a precharge power down standby mode or a self refresh mode, power is not supplied to the driver which produces the column select signal YI in the column select signal decoding unit 120.

In a conventional semiconductor memory apparatus, since power is supplied directly to the driver which produces the column select signal YI in the column decoder, the leakage current is determined by the size of a PMOS transistor in a driver to produce the column select signal YI. However, in the present invention, the leakage current is not determined by the size of a PMOS transistor of a driver to produce the column select signal YI, because power is supplied to the driver to produce the column select signal YI in the column select signal decoding unit through the driving voltage supply controller 140 in the column decoder. Instead, the leakage current is determined by the size of the PMOS transistor used to drive the driving voltage VDD_YI of the voltage supply controller 140. When a column select operation is carried out, a large PMOS transistor to drive the driving voltage VDD_YI of the driving voltage supply controller 140 is not required because only some drivers to produce a few column select signals YI are enabled at a time.

When the column select operation is not carried out, the leakage current, which is generated by the PMOS transistor to drive the driving voltage VDD_YI of the driving voltage supply controller 140, can be reduced significantly since the potential level VPP established by the level shifting unit 1442 is applied to the gate of the PMOS transistor to drive the driving voltage VDD_YI of the driving voltage supply controller 140.

While the present invention has been described with respect to the specific embodiments, it will be apparent to those skilled in the art that various changes and modifications may be made without departing from the spirit and scope of the invention as defined in the following claims. For example, the logic gates and the transistors illustrated above can be modified based on the phase of the input signals.

What is claimed is:

1. A semiconductor device, comprising:

a column select signal decoding means, which has a driving voltage input node and uses a driving voltage, for producing a plurality of column select signals by decoding column select control signals; and a driving voltage supply control means for controlling a supply of the driving voltage to the driving voltage input node, wherein the driving voltage supply control means includes a driving voltage switching means having a transistor, which has a source-drain connection between a power voltage and the driving voltage input node and has a gate to which a power control signal is applied, and a level shifting means for shifting a potential level of the power control signal to a predetermined potential level.

2. The semiconductor device in accordance with claim 1, further comprising a memory controller for outputting one of an entry signal, an escape signal, and both for specific operating modes in which the plurality of column select signals are inactivated.

3. The semiconductor device in accordance with claim 1, wherein the driving voltage supply control means prevents the driving voltage from being provided to the driving voltage input node in response to an entry signal being activated based on a specific operating mode.

4. The semiconductor device in accordance with claim 1, wherein the driving voltage supply control means provides the driving voltage to the driving voltage input node in response to an escape signal being activated based on a specific operating mode.

5. The semiconductor device in accordance with claim 1, wherein the driving voltage supply control means includes a power control signal logic decision means for deciding a logic level of the power control signal in response to the entry and escape signals based on a specific operating mode, wherein the driving voltage switching means controls the supply of the driving voltage to the driving voltage input node in response to the logic level of the power control signal.

6. The semiconductor device in accordance with claim 1, wherein the transistor of the driving voltage switching means includes a PMOS transistor.

7. The semiconductor device in accordance with claim 1, wherein the transistor of the driving voltage switching means includes an NMOS transistor.

8. The semiconductor device in accordance with claim 1, wherein a specific operating mode includes a precharge power down standby mode.

9. The semiconductor device in accordance with claim 1, wherein a specific operating mode includes a self refresh mode.

10. The semiconductor device in accordance with claim 5, wherein the power control signal logic decision means activates the power control signal in response to an activation of an entry signal based on a specific operating mode.

11. The semiconductor device in accordance with claim 5, wherein the power control signal logic decision means inactivates the power control signal in response to an activation of an escape signal based on a specific operating mode.

12. The semiconductor device in accordance with claim 5, wherein the power control signal logic decision means includes:

a pull-up driving unit for performing a pull-up driving operation at a driving node in response to at least one escape signal based on a specific operating mode;

a pull-down driving unit for performing a pull-down driving operation at the driving node in response to at least one entry signal based on a specific operating mode; and a latch circuit for temporally storing a logic value on the driving node and outputting an inverted signal as the power control signal.

13. The semiconductor device in accordance with claim 5, wherein the driving voltage switching means provides the driving voltage for the driving voltage input node when the power control signal is activated.

14. The semiconductor device in accordance with claim 5, wherein the driving voltage switching means prevents the driving voltage from being provided to the driving voltage input node when the power control signal is inactivated.

15. The semiconductor device in accordance with claim 12, wherein the power control signal logic decision means further includes an initialization unit to perform a pull-up operation at the driving node in response to a power-up signal which is generated during an initialization period of a semiconductor memory apparatus.

16. The semiconductor device in accordance with claim 12, wherein the pull-up driving unit includes:

a first NOR gate to receive a plurality of escape signals based on a specific operating mode; and a first PMOS transistor having a source-drain connection between the driving voltage and the driving node and having a gate to which an output signal of the first NOR gate is applied.

17. The semiconductor device in accordance with claim 12, wherein the pull-down driving unit includes at least one NMOS transistor, each of which has a drain-source connection between the driving node and a ground voltage, and each of which has a gate to which a respective entry signal is applied based on a specific operating mode.

18. The semiconductor device in accordance with claim 12, wherein the latch circuit includes:

a first inverter for receiving a signal on the driving node and outputting an inverted signal as the power control signal; and a second inverter for inverting an output signal of the first inverter INV1 and outputting the inverted signal to an input of the first inverter.

19. The semiconductor device in accordance with claim 15, wherein the initialization unit includes a PMOS transistor having a gate to receive the power-up signal and having a source-drain connection between the driving voltage and the driving node.

* * * * *